US008541309B2

United States Patent
Rye et al.

(10) Patent No.: US 8,541,309 B2
(45) Date of Patent: Sep. 24, 2013

(54) PROCESSING ASSEMBLY FOR SEMICONDUCTOR WORKPIECE AND METHODS OF PROCESSING SAME

(75) Inventors: Jason Rye, Kalispell, MT (US); Kyle M. Hanson, Kalispell, MT (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 12/960,372

(22) Filed: Dec. 3, 2010

(65) Prior Publication Data

US 2012/0142196 A1    Jun. 7, 2012

(51) Int. Cl.
*H01L 21/302* (2006.01)

(52) U.S. Cl.
USPC ........... 438/691; 438/692; 118/418; 118/429; 156/345.18; 156/345.54

(58) Field of Classification Search
USPC ................. 438/689–693; 118/409, 416, 418, 118/423, 429; 156/345.18, 345.29, 345.54, 156/345.55
See application file for complete search history.

(56) References Cited

U.S. PATENT DOCUMENTS

| 7,416,632 | B2 * | 8/2008 | Orii et al. | 156/345.1 |
| 2002/0006876 | A1 * | 1/2002 | Hongo et al. | 505/191 |
| 2003/0089608 | A1 * | 5/2003 | Kumekawa | 204/471 |
| 2004/0253833 | A1 | 12/2004 | Takehiko | |
| 2007/0110895 | A1 | 5/2007 | Rye | |
| 2007/0240638 | A1 | 10/2007 | Akimoto | |
| 2009/0056766 | A1 | 3/2009 | Nanba | |

FOREIGN PATENT DOCUMENTS

| KR | 757911 B1 | 9/2007 |
| KR | 797081 B1 | 1/2008 |
| KR | 2009029408 A | 3/2009 |
| KR | 2010045802 A | 5/2010 |
| KR | 2010046800 A | 5/2010 |

OTHER PUBLICATIONS

International Search Report and Written Opinion mailed Jul. 31, 2012, issued in corresponding International Application No. PCT/US2011/063135, filed Dec. 2, 2011, 14 pages.
International Search Report and Written Opinion mailed Jul. 31, 2012, issued in International Application No. PCT/US2011/063145, filed Dec. 2, 2011, 11 pages.

* cited by examiner

*Primary Examiner* — Hsien Ming Lee
(74) *Attorney, Agent, or Firm* — Christensen O'Connor Johnson Kindness PLLC

(57) ABSTRACT

A processing assembly for a semiconductor workpiece generally includes a rotor assembly capable of spinning a workpiece, a chemistry delivery assembly for delivering chemistry to the workpiece, and a chemistry collection assembly for collecting spent chemistry from the workpiece. The chemistry collection assembly includes a weir assembly surrounding the rotor assembly and having a plurality of weirs. Methods for processing a semiconductor workpiece generally include moving at least one of the rotor assembly and the weir assembly.

23 Claims, 9 Drawing Sheets

PROCESSING ASSEMBLY FOR SEMICONDUCTOR WORKPIECE AND METHODS OF PROCESSING SAME

BACKGROUND

In general, semiconductor devices are manufactured by fabrication processes that form electric circuits on a semiconductor substrate, such as a silicon wafer. The fabrication processes usually include various sequences of different process steps, such as deposition, planarizing, photolithography, and ion implantation. Cleaning (such as etching and rinsing) steps are carried out between the various processing steps to remove contaminants from the substrate.

For example, copper is commonly deposited on silicon wafers in semiconductor fabrication. It is well known, however, that copper ions act as a contaminate in semiconductor fabrication. In that regard, copper ions, will diffuse into the silicon and change the conductivity of the silicon. Moreover, copper deposition at the bevel can flake and be unstable and therefore usually requires some etching. Therefore, copper ions are preferably cleaned or etched from all surfaces of the workpiece after a copper deposition process so as to prevent contamination and/or unwanted flaking.

A typical copper cleaning solution for semiconductors is dilute sulfuric peroxide chemistry. This chemistry, or other cleaning solutions, may be used to clean the back side of the workpiece, around the edge (bevel), and on other specific areas on the front side.

In previously designed chambers, masked areas on the wafer prevented the wafer from being fully exposed to the cleaning chemistry, which resulted in contamination. In addition, chemistry collection areas in the chamber for collecting spent cleaning chemistry were not optimized to prevent chemical splash, also resulting in contamination undesirable etching, for example, etching of the front or back side surfaces during the bevel etch process. Moreover, chemistry collection was not optimized for recovery and reuse.

Therefore, there exists a need for a chamber designed to clean a workpiece with reduced masking and improved chemistry collection techniques to minimize splashing and optimize recovery.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with one embodiment of the present disclosure, a processing assembly for a semiconductor workpiece is provided. The processing assembly generally includes a rotor assembly capable of spinning a workpiece, and a chemistry delivery assembly for delivering chemistry to the workpiece. The processing assembly further includes a chemistry collection assembly for collecting spent chemistry from the workpiece, wherein the chemistry collection assembly includes a weir assembly surrounding the rotor assembly and having a plurality of weirs.

In accordance with another embodiment of the present disclosure, a method of processing a semiconductor workpiece is provided. The method generally includes receiving a workpiece in a processing assembly, wherein the processing assembly includes a rotor assembly, a chemistry delivery assembly, and a chemistry collection assembly including a weir assembly. The method further includes moving the weir assembly from a first position to a second position, and processing the workpiece in a first processing step when the weir assembly is in the second position.

In accordance with another embodiment of the present disclosure, a method of processing a semiconductor workpiece is provided. The method generally includes receiving a workpiece in a processing assembly, wherein the processing assembly includes a rotor assembly, a chemistry delivery assembly, and a chemistry collection assembly including a weir assembly having first and second weirs. The method further includes processing the workpiece in a first processing step, including delivering chemistry to the workpiece and collecting spent chemistry in a first weir. The method further includes moving at least one of the rotor assembly and the chemistry collection assembly, and processing the workpiece in a second processing step, including delivering chemistry to the workpiece and collecting spent chemistry in a second weir.

DESCRIPTION OF THE DRAWINGS

The foregoing aspects and many of the attendant advantages of this disclosure will become more readily appreciated by reference to the following detailed description, when taken in conjunction with the accompanying drawings, wherein.

DETAILED DESCRIPTION

Figure 1:
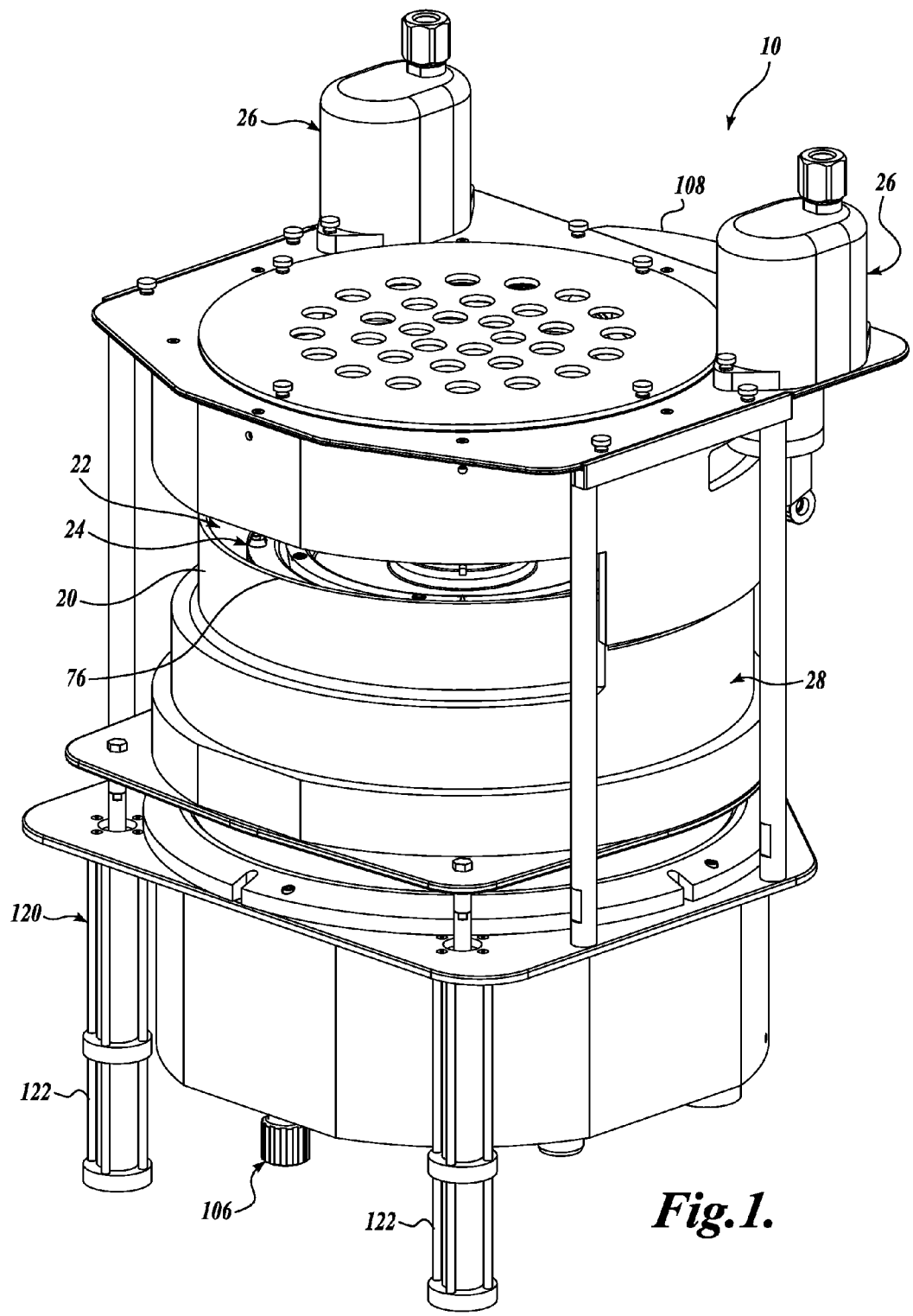
FIG. 1 is a front isometric view of a processing assembly in accordance with one embodiment of the present disclosure.

Embodiments of the present disclosure are directed to processing assemblies for processing a workpiece, such as a semiconductor wafer, and methods of processing the same. The term workpiece, wafer, or semiconductor wafer means any flat media or article, including semiconductor wafers and other substrates or wafers, glass, mask, and optical or memory media, MEMS substrates, or any other workpiece having micro-electric, micro-mechanical, or microelectro-mechanical devices.

A processing assembly 10 constructed in accordance with one embodiment of the present disclosure may be best understood by referring to FIGS. 1-5. The processing assembly 10 has an outer wall 20 defining an inner processing chamber 22, and a rotor assembly 24 for receiving, positioning, and spinning a workpiece W disposed within the processing chamber 22. The processing assembly 10 further includes a chemistry delivery assembly 26 for delivering chemistry to the workpiece W and a chemistry collection assembly 28 for collecting and either disposing of or recycling the used chemistry.

Although shown and described as being directed to a cleaning or etching assembly designed for cleaning semiconductor workpieces, it should be appreciated that embodiments of the present disclosure may be applicable in other non-cleaning semiconductor fabrication applications. Spatially relative terms used herein, for example, top, front, bottom, back high, intermediate, low, up, down, upwardly, downwardly, etc., are used to simplify the description of the illustrated embodiment for the reader and are not intended to be limiting.

The rotor assembly 24 is configurable in a plurality of positions, e.g., a first down position (see FIGS. 5, 6, and 8) and a second up position (see FIG. 7) to achieve various processing results for a workpiece W. In addition, the chemistry collection assembly 28 is configurable in a plurality of positions, e.g., a first down position (see FIG. 5), a second up position (see FIGS. 6 and 7), and a third intermediate position (see FIG. 8), wherein each of the various positions allow for loading the workpiece W into the processing assembly 10 and thereafter achieving various processing results for the workpiece W.

Figure 6:
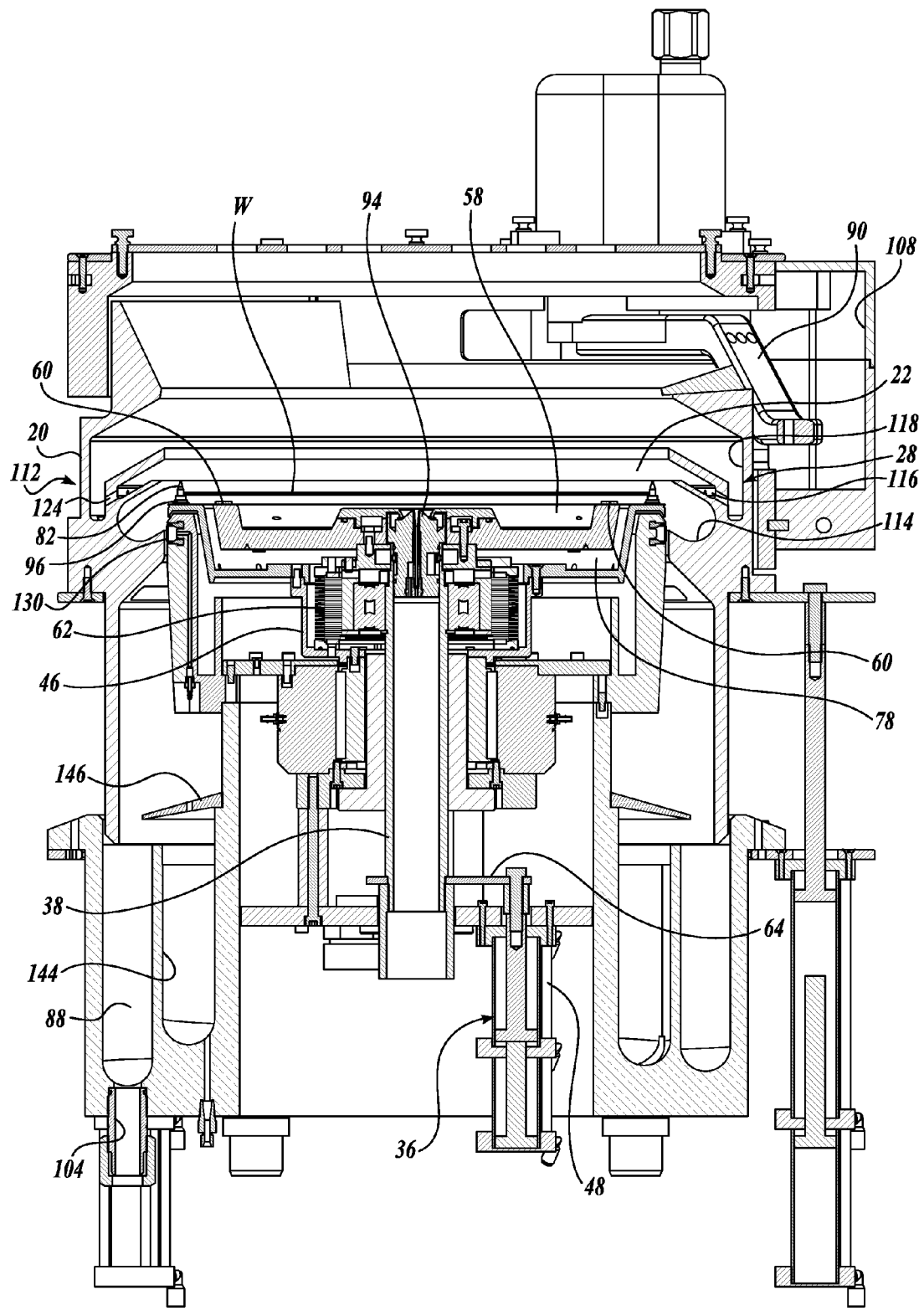
FIG. 6 is a cross-sectional view of the processing assembly shown in FIG. 1, wherein the processing assembly is in a second processing assembly configuration for processing a workpiece, i.e., the rotor assembly is in a first (down) position and the chemistry collection assembly is in a second (up) position.
Figure 7:
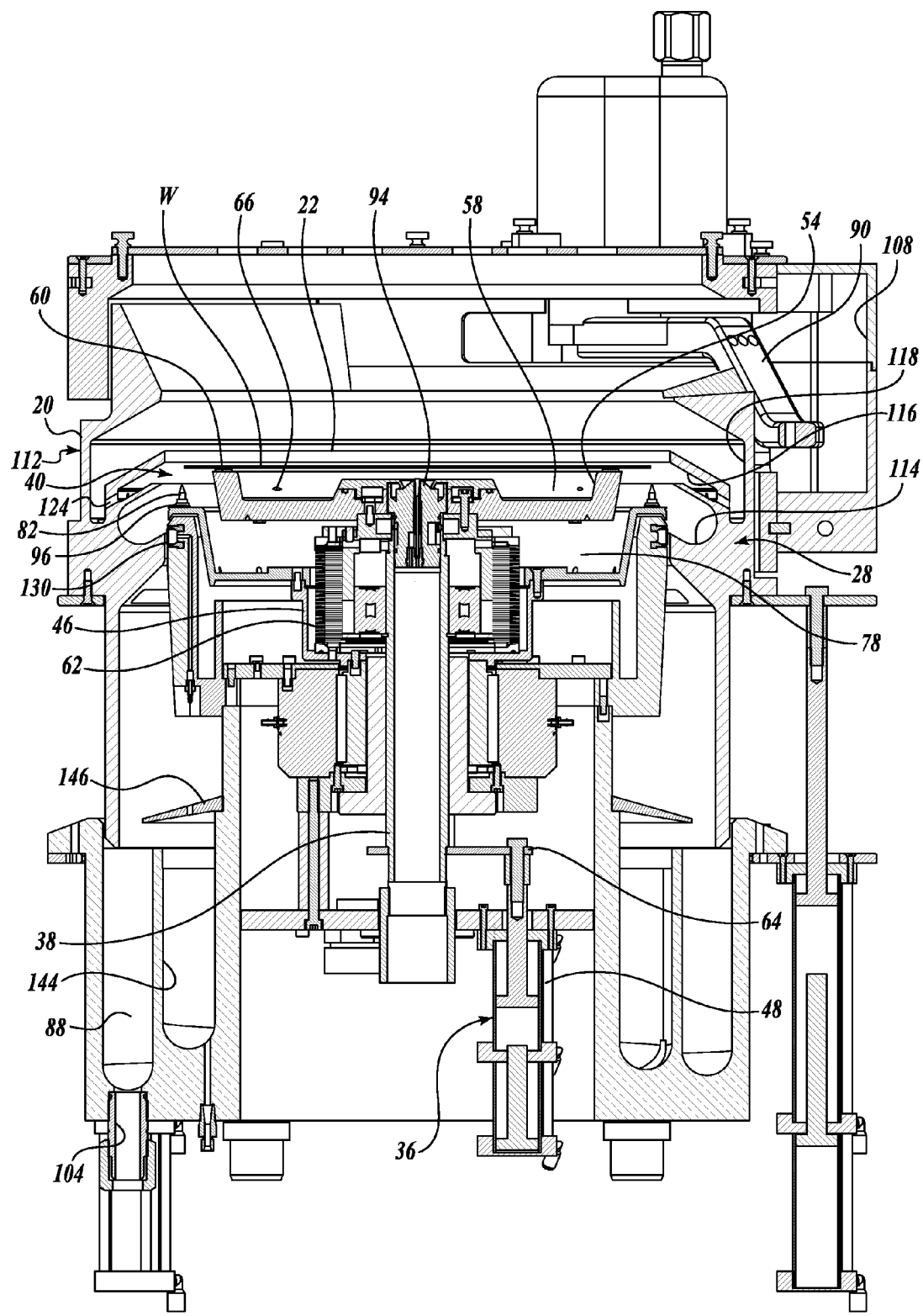
FIG. 7 is a cross-sectional view of the processing assembly shown in FIG. 1, wherein the processing assembly is in a third processing assembly configuration for processing a workpiece, i.e., the rotor assembly is in a second (up) position and the chemistry collection assembly is in a second (up) position.
Figure 8:
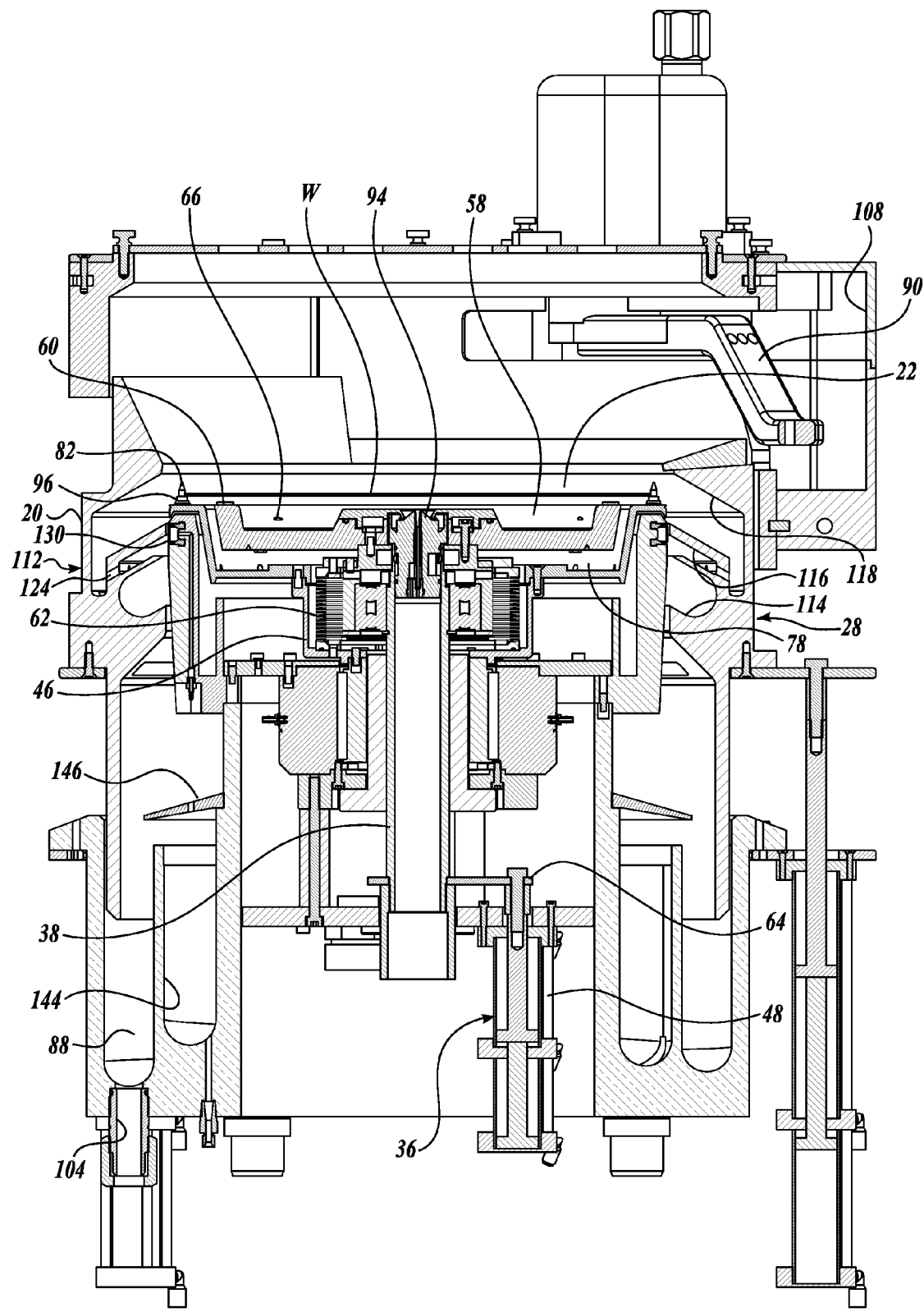
FIG. 8 is a cross-sectional view of the processing assembly shown in FIG. 1, wherein the processing assembly is in a fourth processing assembly configuration for processing a workpiece, i.e., the rotor assembly is in a first (down) position and the chemistry collection assembly is in a third (intermediate) position.

The series of FIGS. 5-8 are directed to respective first, second, third, and fourth processing assembly configurations. The workpiece W is received when the processing assembly 10 is in the first processing assembly configuration, i.e., the rotor assembly 24 is in the first (down) position and the chemistry collection assembly 28 is in the first (down) position (see FIG. 5). After the workpiece W has been received, the rotor assembly 24 and the chemistry collection assembly 28 can be moved through a series of various position combinations for processing the workpiece W such that the workpiece W is oriented in different positions relative to the rotor assembly 24 and the chemistry collection assembly 28 (see FIGS. 6-8), for example, as follows:

(1) the bottom surface (back side) of the workpiece W can be processed when the processing assembly 10 is in the second processing assembly configuration, i.e., the rotor assembly 24 is in its first (down) position and the chemistry collection assembly 28 is in its second (up) position (see FIG. 6);

(2) the outer edge (bevel), bottom surface (back side), and/or top surface (front side) of the workpiece W can be processed when the processing assembly 10 is in the third processing assembly configuration, i.e., the rotor assembly 24 is in its second (up) position and the chemistry collection assembly 28 is in its second (up) position (see FIG. 7); and (3) the workpiece can then be rinsed and dried when the processing assembly is in the fourth processing assembly configuration, i.e., the rotor assembly 24 is in its first (down) position and the chemistry collection assembly 28 is in its third (intermediate) position (see FIG. 8).

Figure 3:
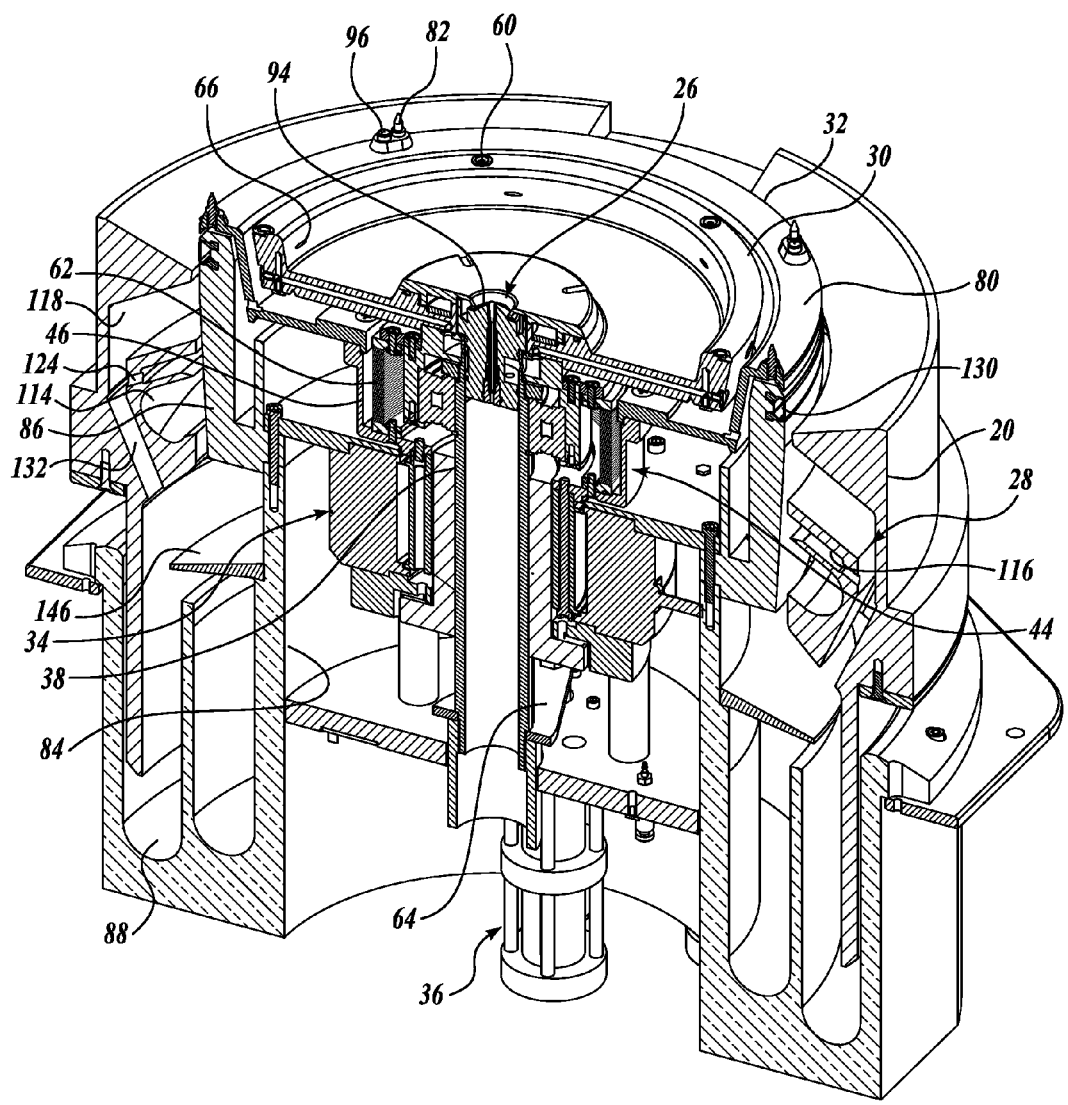
FIG. 3 is a cross-sectional isometric view of a portion of the processing assembly of FIG. 1.
Figure 4:
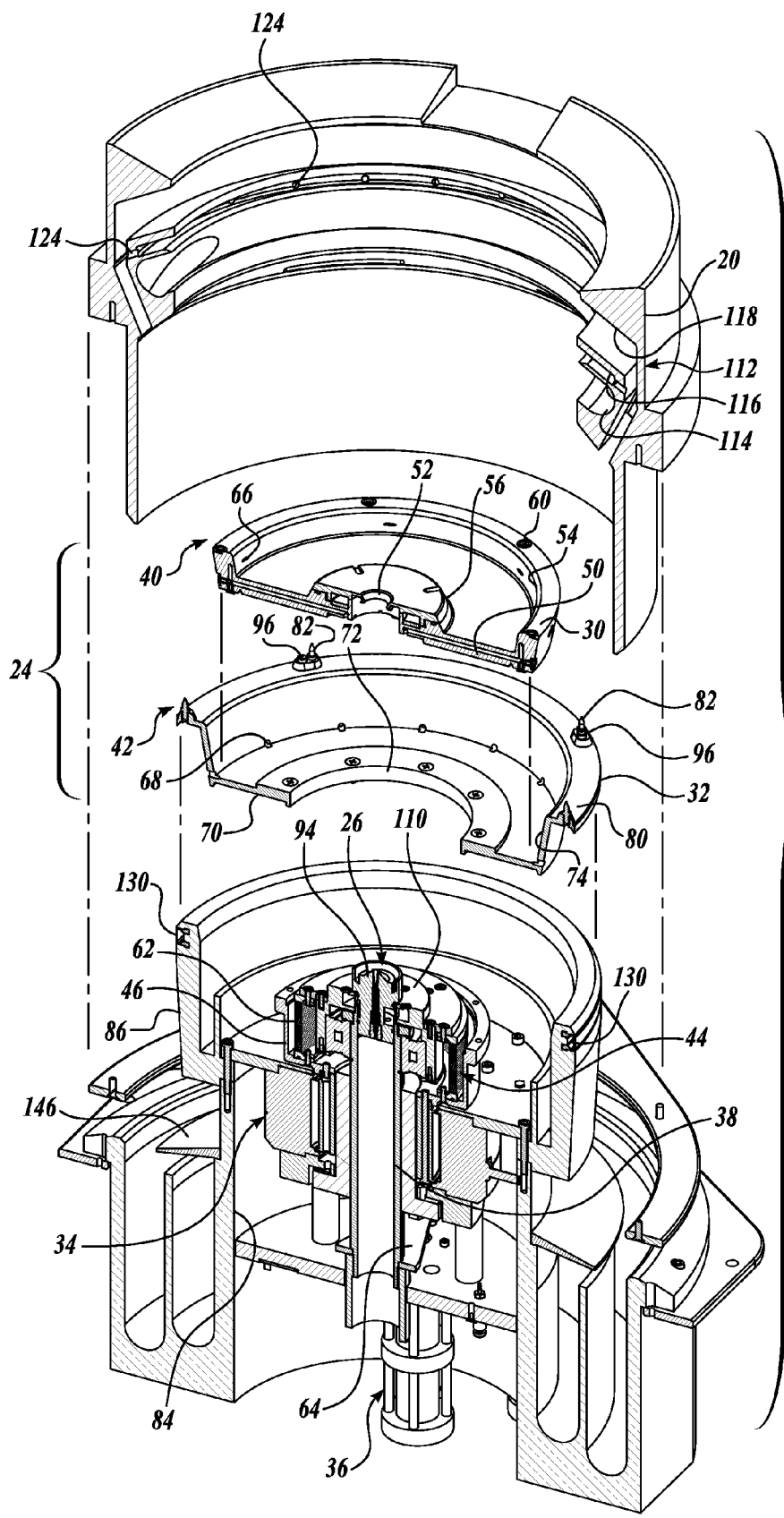
FIG. 4 is a cross-sectional exploded view of the portion of the processing assembly of FIG. 3.

The rotor assembly 24 will now be described. Referring to FIGS. 3 and 4, the rotor assembly 24 generally includes concentric first and second rotors 30 and 32 for receiving, positioning, and spinning a workpiece W (workpiece W shown in FIG. 5). A driving assembly 34 rotates rotors 30 and 32 around a center shaft 38, and an actuating assembly 36 transmits linear movement to at least a portion of the rotor assembly 24. As can be seen in FIGS. 3 and 4, both the driving assembly 34 and the actuating assembly 36 are contained within a lower housing portion 84, which is designed to protect these components from the chemistry that runs through the inner chamber 22 of the processing assembly 10 or other environmental contamination. The first and second rotors 30 and 32 are substantially contained within an upper housing portion 86.

The driving assembly 34 includes a spinning motor for driving the rotor assembly 24 via a transmission assembly 44. The transmission assembly 44 includes a first coupler 46, and a second coupler 62. The upper edge of the first coupler 46 is coupled to the base portion 70 of the second rotor 32 for transmitting torque to the second rotor 32. The first coupler 46 then transmits torque to the first rotor 30 via the second coupler 62. In the illustrated embodiment, the first coupler 46 also serves as a protective housing for the second coupler 62.

Figure 5:
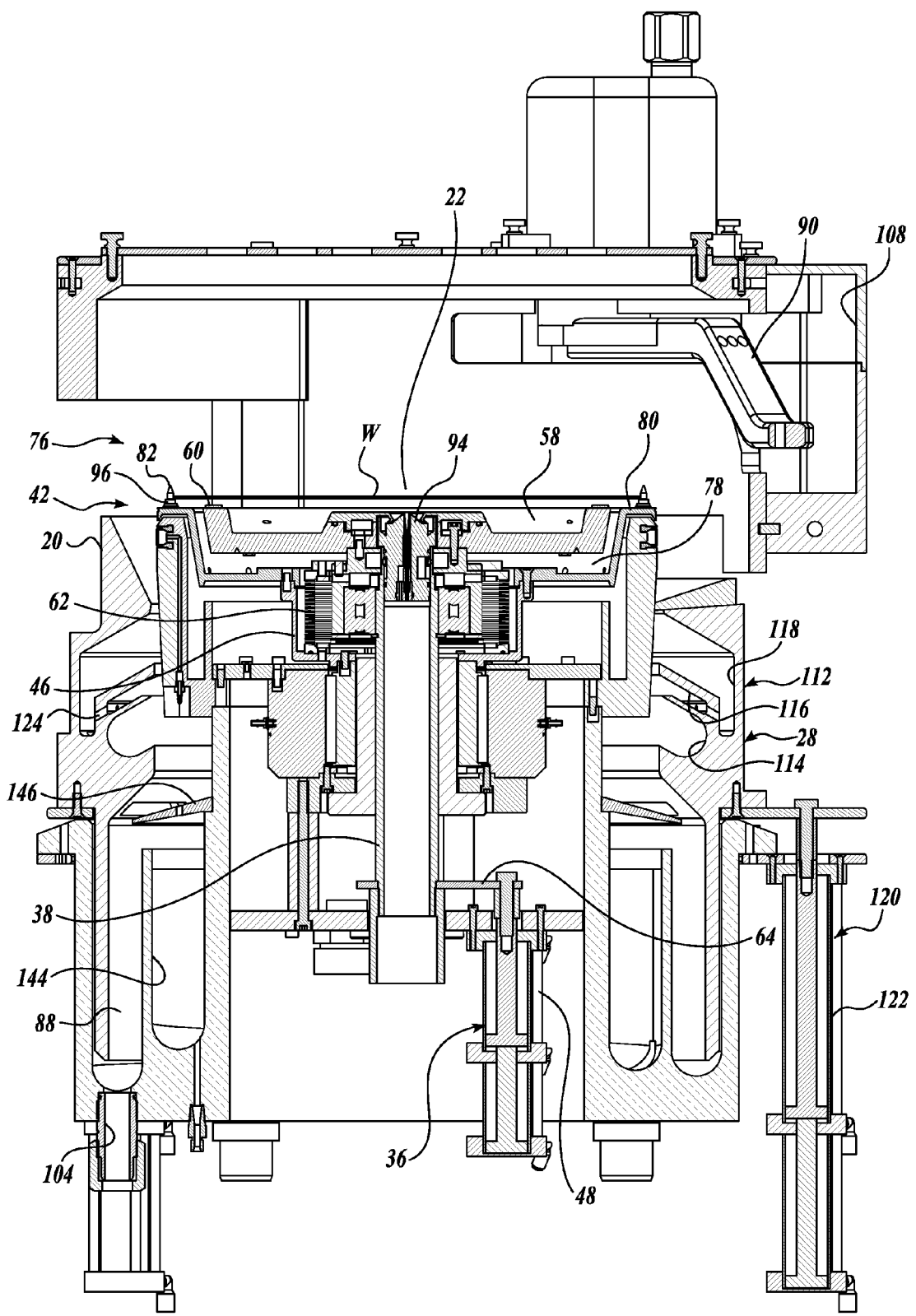
FIG. 5 is a cross-sectional view of the processing assembly shown in FIG. 1, wherein the processing assembly is in a first assembly configuration for receiving a workpiece, i.e., the rotor assembly is in a first (down) position and the chemistry collection assembly is in a first (down) position.

The second coupler 62 is an expandable coupling device, as seen by comparing the sizing of the second coupler 62 in FIGS. 5 and 7. As a non-limiting example, the second coupler 62 may be an accordion style bellows made from a polymer material, such as a fluorocarbon polymer, polypropylene, or polyethylene. Suitable polymers may include, but are not limited to, polytetrafluoroethylene (PTFE), perfluoroalkoxy (PFA), fluorinated ethylene propylene (FEP), polyvinylidene fluoride (PVDF), ethylene chlorotrifluoroethylene (ECTFE), polychlorotrifluoroethylene (PCTFE), ethylene tetrafluoroethylene (ETFE), and equivalents. In one non-limiting example, the second coupler is a PTFE bellows having a wall thickness of about 0.015 inches or greater.

The expandable polymer coupler 62 provides an acid proof or corrosion resistant barrier between the chemistry in the processing chamber 22 and the center shaft 38. In that regard, the center shaft 38 is typically made from metal, may be lubricated, and may include a ball bearing component. Therefore, the shielding second coupler 62 prevents fluid or other contamination in the center shaft 38, which if allowed to occur, may cause part failure. Because the second coupler 62 is expandable it protects the center shaft 38 as the rotor assembly 24 is actuated through its various positions (see FIGS. 5 and 7).

The inventors determined that second coupler 62, when made from a polymer material, has enough stiffness to transmit torque to the first rotor 30 from the second coupler 46. As seen in FIG. 5, the second coupler 62 can also provide an inner wall defining the inner cavity 78 of the second rotor 32.

The center shaft 38 moves axially, but it does not rotate. Therefore, the rotors 30 and 32 spin around the center shaft 38. As seen in FIGS. 3 and 4, the center shaft 38 is a hollow shaft configured to receive other elements or instruments for processing the workpiece W. For example, as seen in the illustrated embodiment, the shaft 38 houses nozzle 94 of the chemistry delivery assembly 26 for chemistry delivery to the back side of the workpiece W, as described in greater detail below.

The actuating assembly 36 is coupled to the rotor assembly 24 for actuating the rotor assembly 24. In that regard, the actuating assembly 36 changes the relative positioning of first and second workpiece receiving portions 40 and 42 of the respective first and second rotors 30 and 32. For example, compare the positioning of the first and second workpiece receiving portions 40 and 42 in respective FIGS. 7 and 5.

The actuating assembly 36 includes an actuator 48 to raise and lower arm 64, which is coupled to the center shaft 38. Non-limiting examples of a suitable actuator include a pneumatic actuator and a servo-driven actuator. The center shaft 38 includes a coupling portion 110 for coupling with the first rotor 30 (see FIG. 4). Via arm 64, actuator 48 transmits linear movement (e.g., up and down movement) to the first rotor 30. As a non-limiting example, the actuating device may be a ball spline.

In the illustrated embodiment, the actuating assembly 36 is configured to transmit linear movement only to the first rotor 30, and not to the second rotor 32. In that regard, the first rotor 30 is coupled to the center shaft 38, but the second rotor 32 is not coupled to the center shaft 38 and merely rotates around the center shaft 38. However, in other embodiments of the present disclosure, the actuating assembly 36 may be configured to transmit linear movement to the second rotor 32, or the actuating assembly 36 may be configured to independently move either or both of the first and second rotors 30 and 32 to change the axial spacing.

The first and second rotors 30 and 32 are designed and configured such that the rotor assembly 24 can be positioned in various orientations to change the axial spacing between the workpiece receiving portions 40 and 42 of the respective first and second rotors 30 and 32. In the illustrated embodiment, the rotor assembly 24 is positionable in at least two orientations, as follows:

(1) first rotor 30 in a first "down" position relative to second rotor 32, which is selected for receiving or transferring a workpiece W to or from the processing chamber 22, as well as for various processing steps (see FIGS. 5, 6, and 8); and (2) first rotor 30 in a second "up" position relative to second rotor 32, which is selected for generally processing the outer edge or bevel of the workpiece W, the front side or top surface of the workpiece W, as well as the back side or bottom surface of the workpiece W (see FIG. 7).

Although the illustrated embodiment is shown and described as moving the first rotor 30 to two different positions relative to a fixed second rotor 32, it should be appreciated that the plurality of positions result in a change in axial spacing between the first and second workpiece receiving portions 40 and 42. Therefore, it should be appreciated that other embodiments directed to moving the second rotor 32 relative to a fixed first rotor 30 or moving both rotors 30 and 32 independent of one another to achieve variations in axial spacing are also within the scope of the present disclosure.

The first rotor 30 is a chuck rotor for receiving and supporting the workpiece W. As seen in FIG. 4, the first rotor 30 has a base portion 50 defining a center hole 52 through which the shaft 38 is received. The shaft 38 couples to the base portion 50 via shaft coupling portion 110 and aligns with the center hole 52 of the base portion 50. Therefore, various elements or instruments disposed within the hollow shaft 38 (such as nozzle 94 of the chemistry delivery assembly 26) have access to the back or bottom surface of the workpiece W when it is received on the first rotor 30. The first rotor 30 further includes an annular outer sidewall 54 along the outer perimeter of the base portion 50 and an annular inner sidewall 56, wherein the sidewalls 54 and 56 define a cavity 58 adjacent the base portion 50 (see cavity 58 in FIGS. 5-8). Along the inner surface of the outer sidewall 54, the first rotor 30 includes a plurality of ports 66 for delivering vortex generating gas to the cavity 58, as described in greater detail below.

The first rotor 30 includes the first workpiece receiving portion 40 (see FIGS. 4 and 7). In the illustrated embodiment, the workpiece receiving portion 40 includes a plurality of standoffs 60 extending upwardly from the outer sidewall 54 for receiving and supporting the workpiece W (see FIG. 7). The standoffs 60 are configured for contacting the workpiece W on its back side. In the illustrated embodiment, the first rotor 30 includes six standoffs 60 (see FIG. 3); however it should be appreciated that any suitable number of standoffs 60 are within the scope of the present disclosure. The standoffs 60 serve to create spacing between the outer sidewall 54 and the workpiece W when the workpiece W is forced against the first rotor 30. Such spacing allows for optimized chemistry delivery to the back side of the workpiece W through the shaft 38 for back side cleaning, as described in greater detail below.

When the first rotor 30 has received a workpiece W (as can be seen in FIG. 7), two forces acting in concert keep the workpiece W on the first workpiece receiving portion 40 of the first rotor 30 and overcome any centrifugal forces (if the workpiece W is spinning) that might force the workpiece W to deviate from its center position. First, the frictional force between the workpiece W and the standoffs 60 maintain the workpiece W on the first workpiece receiving portion 40.

Second, a pressure differential is also used to maintain the workpiece W in position on the first rotor 30. In that regard, the first rotor 30 is capable of generating a vortex force in cavity 58, i.e., creating a relatively low pressure area below the workpiece W compared to above the workpiece W to provide a force parallel to the direction of the central axis of the first rotor 30 (i.e., orthogonal to the top surface of the workpiece W) to essentially force the workpiece W against the first rotor 30. A suitable vortex rotor is described in U.S. Patent Publication No. US 2007/0110895, published on May 17, 2007, the disclosure of which is hereby expressly incorporated by reference.

In the illustrated embodiment, gas flows into the vortex cavity 58 through ports 66 that are oriented tangentially along the perimeter of the cavity 58. The jets of gas that flow from the ports 66 create a circular path, like a tornado, generating a negative pressure region at the center of the vortex. The negative pressure of the vortex creates a pressure differential between the atmosphere and the cavity 58 to essentially force the workpiece W against the first rotor 30. As will be described in greater detail below, the vortex is a proximate vortex designed to create a pressure differential that maintains the positioning of the workpiece W at variable distances relative to the cavity 58 of the first rotor 30 (for example, at the positions of the rotor assembly 24 shown in FIGS. 5 and 7).

Typically, nitrogen is used as a vortex gas because it is an inert gas that not only lowers the risk of contamination in the processing assembly, but also eliminates oxygen to reduce the explosion potential in the chamber. However, it should be appreciated that other inert gases, such as helium, are also within the scope of the present disclosure. Moreover, non-inert gases, such as air, may also be used if contamination and explosion potential risks are not of concern.

The second rotor 32 is a centering rotor for centering the workpiece W in the processing assembly 10. Referring to FIG. 4, the second rotor 32 has a base portion 70 defining a center hole 72 through which the shaft 38 and transmission 44 are received. Like the first rotor 30, the shaft 38 aligns with the center hole 72 such that various elements or instruments (such as nozzle 94 of the chemistry delivery assembly 26) have access to the back or bottom surface of the workpiece W when it is received on either the first or second rotor 30 or 32. The second rotor 32 further includes an annular sidewall 74 along the outer perimeter of the base portion 70. Therefore, the base portion 70, sidewall 74, center shaft coupling portion 110, and transmission 114 define an inner cavity 78 adjacent the base portion 70 (see inner cavity 78 in FIGS. 5-8).

As seen in FIG. 4, the base portion 70 may include a plurality of drain holes 68 along the outer perimeter for evacuating chemistry from the inner cavity 78, for example, rinsing chemistry applied to the rotor assembly 24 when the rotor assembly 24 is not spinning. However, it should be appreciated that when the rotor assembly 24 is spinning, chemistry will generally evacuate up sidewall 74 and over upper surface 80.

The inner cavity 78 within the second rotor 32 is configured for receiving the first rotor 30. In that regard, the first rotor 30 has an outer circumference that is smaller than the inner circumference of the annular sidewall 74 of the second rotor 32, and therefore is designed to nest within the second rotor 32. As a result of the nesting capability of the first and second rotors 30 and 32, the first rotor 30 is able to move axially relative to the second rotor 32, as seen in the plurality of positions of the rotor assembly 24, for example, compare the positioning of the rotor assembly 24 in FIGS. 5 and 7. The nesting capability of the first and second rotors 30 and 32 allows for compact sizing of the processing assembly 10 to accommodate both rotors 30 and 32, resulting in processing and manufacturing efficiencies as a result of such compact sizing.

Extending laterally outward from the upper end of sidewall 74, the second rotor 32 further includes an upper surface 80 for supporting the second workpiece receiving portion 42 (see FIGS. 4 and 5). In the illustrated embodiment, the second workpiece receiving portion 42 includes a plurality of centering guide posts 82 and a plurality of standoffs 96 extending upwardly from the upper surface 80. In the illustrated embodiment, the second rotor 30 includes six guide posts 82 and six standoffs 96 (see FIG. 3); however it should be appreciated that any suitable number of guide posts and standoffs are within the scope of the present disclosure.

Referring to FIGS. 3 and 4, the guide posts 82 are located along the upper surface 80 at locations that approximate the circumference of an imaginary workpiece W. In the illustrated embodiment, the guide posts 82 are oriented substantially parallel to the direction of the central axis of the rotor assembly 24 (i.e., orthogonal to the top surface of the workpiece W). However, it should be appreciated that the guide posts 82 may be oriented at a slight angle away from the central axis of the rotor assembly 24, as shown and described in U.S. patent application Ser. No. 12/960,378 the disclosure of which is hereby expressly incorporated by reference. The guide posts 82 are configured to receive and contact a workpiece W along the outer bevel of the workpiece W.

The guide posts 82 are configured to taper in their cross-sectional area to increase as they approach the upper surface 80 of the second rotor 32. When a workpiece W is received by the guide posts 82, gravity forces the workpiece W downward against the guide posts 82. Therefore, as the workpiece W is received by the guide posts 82, it becomes centered between the guide posts 82, in both axial and radial directions, and the guideposts 82 minimize any side-to-side movement. Such centering improves the concentricity of a processed workpiece W, that is, the consistency of the average bevel clean or etch width and the range for minimum and maximum widths.

As seen in FIGS. 5, 6, and 8, as the workpiece W approaches the bottom of the guide posts 82, it is centered and set to rest on standoffs 96 on the second rotor 32. When resting on standoffs 96, the workpiece W does not contact the first rotor 30 or the standoffs 60 on the first rotor 30. The standoffs 96 allow for a spacing between the upper surface 80 of the second rotor 32 and the workpiece W, such that spent chemistry from back side cleaning can flow to the chemical collection system 28. It should be appreciated that the standoffs 96 on the second rotor 32 contact the workpiece W in different locations than the standoffs 60 on the first rotor 30, such that the standoffs 96 and 60 do not mask any contact areas on the workpiece W from being fully cleaned during the series of processing steps.

Such a guide post 82 centering mechanism is advantageous because the workpiece W always has a centered fit within the guide posts 82. Moreover, in such a guide post 82 centering mechanism, only select portions of the bevel and back side regions of the workpiece W are contacted by, respectively, the centering guideposts 82 and the standoffs 96, allowing for the other surfaces of the workpiece W to be subjected to processing.

In addition to the guide posts 82 along the outer perimeter of the second rotor 32, a frictional force and pressure differential are also used to maintain the workpiece W in position on the second rotor 32 when the rotor assembly 24 is spinning, as described above with reference to the first rotor 30. Regarding the pressure differential, the vortex cavity 58 of the nested first rotor 30 is a proximate vortex that can also be used to force the workpiece W against the second rotor 32. In that regard, the vortex cavity 58 is capable of holding and maintaining a workpiece W for up to about 6 inches in distance from the vortex. This can be contrasted with a standard Bernoulli chuck which does not work with changing proximity more than about 0.080 inch. Therefore, the nesting capability allows for the rotor assembly 24 to use the vortex cavity 58 of the first rotor 30 for holding a workpiece W that is received on either of the first or second receiving portions 40 or 42 of the respective first or second rotors 30 or 32.

Referring to FIGS. 4 and 5, the processing assembly 10 further includes a chemistry collection assembly 28 that collects spent fluids that spin from the rotor assembly 24 for either waste or recycle. The chemistry collection assembly 28 includes a weir assembly 112 that allows for separate collection of various chemistries used during processing. For example, an etching process may use an etching chemistry (such as dilute sulfuric peroxide), followed by a rinsing process using a rinsing chemistry (such as water). The etching chemistry can be recycled and reused. The rinsing chemistry, however, would dilute the etching chemistry if collected together with the etching chemistry, and therefore, is preferably collected separately. In accordance with embodiments of the present disclosure, a first chemistry, such as an etching chemistry, may be collected separately from a second chemistry, such as a rinse chemistry.

As can be seen in FIGS. 4 and 5, the weir assembly 112 is concentric with and in a surrounding relationship with the rotor assembly 24. In the illustrated embodiment, the weir assembly 112 is formed in the outer wall 20 of the processing chamber 10. The weir assembly 112 includes a plurality of separate chemistry receiving channels 114, 116, and 118 that collect fluids that spin tangentially and radially outward from the rotor assembly 24. In the illustrated embodiment, the weir assembly 112 includes three separate chemistry receiving channels; however, it should be appreciated that more or less than three channels are also within the scope of the present disclosure. For example, the weir assembly 112 may only include one chemistry receiving channel that is positionable in, for example, two positions such as automation and processing positions.

The weir assembly 112 is a fixed "non-spinning" assembly, in that it does not spin together with the rotor assembly 24. The weir assembly 112 is designed and configured to be positionable in various orientations to open the processing chamber 10 for changing workpieces, and for positioning the correct chemistry receiving channel (either 114, 116, or 118)

to receive processing chemistry from the rotor assembly 24. A "spinning" weir assembly is shown and described in U.S. patent application Ser. No. 12/960,378, filed on Dec. 3, 2010, the disclosure of which is hereby expressly incorporated by reference.

Referring to FIG. 5, the weir assembly 112 is movable relative to the rotor assembly 24 by a weir assembly actuation system 120, which may include a plurality of pistons 122 or other actuating devices for moving the weir assembly 112 up and down. In the illustrated embodiment, the weir assembly 112 is positionable in at least three orientations as a result of such actuation, as follows:

(1) weir assembly 112 in a first "down" position relative to the rotor assembly 24, which is selected for receiving or transferring a workpiece W to or from the processing chamber 22 (see FIG. 5);

(2) weir assembly 112 in a second "up" position relative to the rotor assembly 24, which is selected for generally processing the outer edge or bevel of the workpiece W, the front side or top surface of the workpiece W, as well as the back side or bottom surface of the workpiece W (see FIGS. 6 and 7), such that collected chemistry is received in the first "low" receiving channel 114; and (3) weir assembly 112 in a third "intermediate" position relative to the rotor assembly 24, which is selected for generally rinsing all surfaces of the workpiece W (see FIG. 8), such that collected chemistry is received in the third "high" receiving channel 118.

It should be appreciated that collected chemistry can be received in the second "intermediate" receiving channel 116 when the weir assembly 112 is in the second "up" position relative to the rotor assembly 24 and the rotor assembly 24 is in the second "up" position. This processing assembly configuration (see FIG. 7) is generally selected for generally processing the outer edge or bevel of the workpiece W.

As described in greater detail below, each of the three receiving channels 114, 116, and 118 is designed and configured for optimizing chemistry collection during the various processing steps. In that regard, the receiving channels 114, 116, and 118 are suitably sized and geometrically designed. The receiving channels 114, 116, and 118 may further be configured to be angled downwardly such that collected chemistry is directed downwardly toward suitable collection chambers and/or drain holes.

Figure 2:
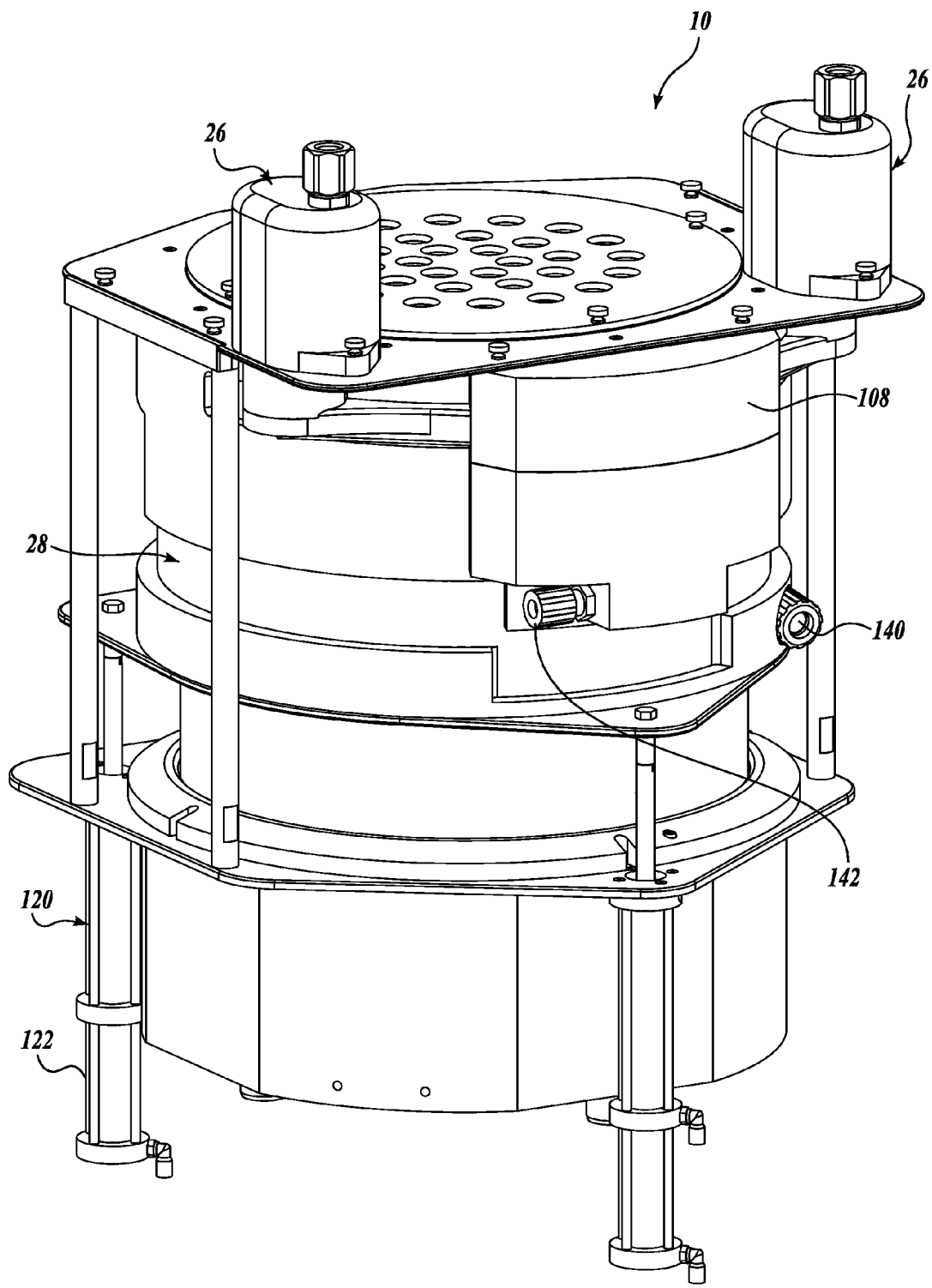
FIG. 2 is a back isometric view of the processing assembly of FIG. 1.

In the illustrated embodiment, the first receiving channel 114 is the lowest oriented of the three receiving channels. It is a large, C-shaped channel configured for receiving etching chemistry (e.g., dilute sulfuric peroxide) during front and back side etching processes. Referring to FIG. 6, as the workpiece W spins on the rotor assembly 24 and chemistry is delivered to the front side of the workpiece W by swing arm 90 and to the back side of the workpiece W by the backside nozzle 94, chemistry that spins from the workpiece W is collected in the first receiving channel 114. Typically, etching chemistry collected in the first receiving channel 114 can be recovered and reused. In that regard, the chemistry that collects in the first receiving channel 114 travels toward and can be removed at drain hole 140 (as seen in FIG. 2).

In the illustrated embodiment, the second receiving channel 116 is the intermediate oriented channel of the three receiving channels. It is a long, thin channel configured for receiving etching chemistry (e.g., dilute sulfuric peroxide) during the bevel etch process. Referring to FIG. 7, as the workpiece W spins on the rotor assembly 24 and chemistry is delivered to the bevel of the workpiece W by swing arm 90, chemistry that spins from the workpiece W is collected in the second receiving channel 116.

Because the weir assembly 112 is a "non-spinning" weir assembly, chemistry that spins off the workpiece W as a result of centrifugal forces has radial and tangential components. The tangential component of the spin-off chemistry is the major portion of the spin-off chemistry. The tangential component tends to splatter and turn into an aerosol. Such aerosol, if left to settle on surfaces both inside and outside the processing chamber 22, will contaminate those surfaces with spent chemistry. While not a major concern during front and back side etching and rinsing, it is a goal of the inventors to minimize splash back and splatter during the bevel etch processing step (see FIG. 7). Therefore, the second receiving channel 116 is therefore designed to be long and thin to minimize splash back during the bevel etch process and prevent undesirable etching of the front and back surfaces of the workpiece W when the bevel is being etched.

In the illustrated embodiment, the third receiving channel 118 is the highest oriented of the three receiving channels. It is a large channel configured for receiving rinsing chemistry (e.g., water) during front side, back side, and bevel rinsing processes. Referring to FIG. 8, as the workpiece W spins on the rotor assembly 24 and chemistry is delivered to the front side and bevel by swing arm 90 and to the back side by the backside nozzle 94, chemistry that spins from the workpiece W is collected in the third receiving channel 118.

Typically, rinsing chemistry collected in the third receiving channel 118 is discarded as waste. Referring to FIG. 3, it can be seen that chemistry travels via drain holes 132 from the third receiving channel 118 to a fixed (non-moving) collection chamber 88 positioned below the drain holes 132. Chemistry may be removed from the collection chamber 88 at the drains 104 (see FIGS. 5-8) which lead to a the drain valve assembly (not shown).

In the illustrated embodiment, the second receiving channel 116 is connected to the third receiving channel 118 via drain hole 124 (see FIG. 4) such that the chemistry received in the second receiving channel 116 can be collected with the chemistry received in the third receiving channel 118. As mentioned above, the chemistry in the third receiving channel is typically discarded as waste. In typical workpiece processing, the bevel etch chemistry only accounts for about 10% of the etching chemistry used in the process, while the back side etch usually accounts for about 90% of the etching chemistry. Therefore, this bevel etch chemistry is oftentimes discarded as waste, because it is a relatively small amount of chemistry compared to the back side etch chemistry. If it is desirable to recover the bevel etch chemistry, it should be appreciated that the second receiving channel 116 may be connected to the first receiving channel 114, in lieu of the third receiving channel 118, in accordance with another embodiment of the present disclosure.

Referring to FIG. 4, a seal 130 positioned on an external surface of the upper housing portion 86 helps to prevent chemistry from traveling from the designated receiving channel to another channel or into the exhaust system. In that regard, the seal 130 may be an inflatable seal for isolating the receiving channels 114, 116, and 118 from one another. For example, referring to FIG. 6, the inflatable seal 130 is capable of being deflated when the weir assembly 112 is moving between positions, then being inflated to provide a seal between the upper housing portion 86 and the weir assembly 112 to prevent chemistry from traveling from the first receiving channel 114 of the weir assembly 112 into gas exhaust plenum 144. Referring to FIG. 8, the inflatable seal 130 may also be inflated to prevent chemistry from traveling from the third receiving channel 118 of the weir assembly 112 into the first or second receiving channels 114 or 116 or into the gas exhaust plenum 144. Exhaust plenum 144 also includes a chemistry shield 146 that directs any chemistry away from exhaust plenum 144 and toward collection chamber 88.

Referring to FIG. 2, the chemistry collection assembly 28 further includes a swing arm dispense cup 108 for receiving flush chemistry from the swing arm assemblies 90 prior to starting up the processing assembly 10. Chemistry from the swing arm dispense cup 108 can be drained at drain hole 142.

A chemistry delivery assembly 26 delivers fluids to various locations on the workpiece, including the front side, the bevel, and the back side. The chemistry delivery assembly 26 includes a front side delivery system, which may include one or more delivery swing arms 90. For example, the workpiece outer edge (bevel) may be processed using, for example, a short swing arm of the chemistry delivery assembly 26. The workpiece top surface (front side) may be processed using, for example, a long swing arm of the chemistry delivery assembly 26. The chemistry delivery assembly 26 further includes a back side delivery system. In the illustrated embodiment, the back side delivery system is a back side delivery nozzle 94 located in the shaft 38 for delivering chemistry to the back side of the workpiece W.

As mentioned above, the processing assembly 10 is configurable in a plurality of processing assembly configurations, i.e., first (FIG. 5), second (FIG. 6), third (FIG. 7), and fourth (FIG. 8) processing assembly configurations, to achieve various processing results for the workpiece W. An exemplary operational sequence for the processing assembly 10 will now be described, wherein the workpiece W transitions in the processing assembly 10 from the first configuration to the second configuration, then to the third configuration, then to the fourth configuration, then back to the first configuration.

The first step of the exemplary operational process is a workpiece automation step for placing a workpiece W in the processing assembly 10. The workpiece does not spin during the automation step. Referring to FIG. 5, the workpiece W is received in the processing assembly 10 in the first processing assembly configuration, i.e., the rotor assembly 24 is in a first (down) position and the chemistry collection assembly 28 is in the first (down) position.

When the rotor assembly 24 is in the first (down) position relative to second rotor 32, the first and second workpiece receiving portions 40 and 42 of the respective first and second rotors 30 and 32 are nested. In this position, because the standoffs 96 on the second rotor 32 sit higher than the standoffs 60 on the first rotor 30, the workpiece W is received by the centering guide posts 82 and, after being centered, is received on the standoffs 96 on the second rotor 32. Therefore, when in the first (down) position, the contact points between the rotor assembly 24 and the workpiece W are the standoffs 96 of the second rotor 32 that contact the back side or bottom surface of the workpiece W. The workpiece W does not contact the first rotor 30 or the first rotor standoffs 60.

When the chemistry collection assembly 28 is in the first (down) position relative to the rotor assembly 24, the outer wall 20 of the processing assembly 10 is lowered such that the weir assembly 112 is below the first and second workpiece receiving portions 40 and 42. Because the weir assembly 112 is lowered below the workpiece receiving portions, it is not in a position to collect spent chemistry and therefore, this first (down) position is selected only for receiving or transferring a workpiece W.

Workpiece transferring to and from the processing assembly 10 may be achieved by using an automated transfer arm or paddle (not shown) to transfer a workpiece through assembly inlet 76 (see FIGS. 1 and 5). As a workpiece W is received, it is dropped onto the second workpiece receiving portion 42 on the second rotor 32 to be received by centering guide posts 82 and standoffs 96. Workpiece detect sensors (not shown) may be positioned to detect a workpiece W and enable automatic workpiece transfer processes.

After the workpiece W has been received in the processing assembly 10, the rotor assembly 24 and/or the chemistry collection assembly 28 can be moved to the subsequent configurations for processing (e.g., see FIGS. 6-8). Movement of the rotor assembly 24 is achieved by manipulating the actuating assembly 36 to raise and lower the position of the first rotor 30 relative to the fixed position of the second rotor 32. Movement of the chemistry collection assembly 28 is achieved by weir assembly actuation system 120 to raise and lower the position of the weir assembly 112 relative to the rotor assembly 24.

The second step of the exemplary operational process is a primary processing step. Referring to FIG. 6, the workpiece W is received in the processing assembly 10 in the second processing configuration, i.e., the rotor assembly 24 remains in the first (down position) and the chemistry collection assembly 28 is moved to the second (up) position. To achieve this processing configuration, a vortex force is generated in the cavity 58 of the first rotor 30 to force the workpiece W to the contact surfaces on the second rotor 32, then the weir assembly 112 is actuated from the first (down) position (see FIG. 5) to the second (up) position (see FIG. 6).

In the second processing configuration, the workpiece W back side may be processed (e.g., cleaned or etched). In that regard, the workpiece W is set to spin using the driving assembly 34. The majority of the surface area of the workpiece W back side may then be cleaned using the back side delivery nozzle 94 of the chemistry delivery assembly 26. Because there are masked contact areas on the back side of the workpiece W when it is positioned on the standoffs 96, this surface cannot be fully processed (e.g., cleaned or etched). Spent cleaning chemistry is collected in the first receiving channel 114 of the weir assembly 112.

The third step of the exemplary operational process is a secondary processing step. Referring to FIG. 7, the workpiece W is received in the processing assembly 10 in the third processing configuration, i.e., the rotor assembly 24 is moved to the second (up) position and the chemistry collection assembly 28 remains in the second (up) position. To achieve this processing configuration, the vortex force is maintained in the cavity 58 of the first rotor 30 to force the workpiece W to the contact surfaces on the second rotor 32, then the rotor assembly 24 is actuated from the first (down) position (see FIG. 6) to the second (up) position (see FIG. 7).

When transitioning from the second processing configuration (FIG. 6) to the third processing configuration (FIG. 7), the first rotor 30 un-nests from the second rotor 32. In this transition, the workpiece W is transferred from the standoffs 96 on the second rotor 32 to the standoffs 60 on the first rotor 30.

In the third processing configuration, the workpiece W outer edge (bevel) may be processed using, for example, a swing arm assembly of the chemistry delivery assembly 26. The workpiece top surface (front side) may be processed using, for example, a swing arm assembly of the chemistry delivery assembly 26. Because there are no contacts on the bevel or the front side of the workpiece W when it is positioned on the standoffs 60, these surfaces can be fully processed (e.g., cleaned or etched).

The back side of the workpiece W can also be processed, to clean the areas that were masked when the workpiece W was positioned in the second processing configuration on standoffs 96. In that regard, the standoffs 60 of the first rotor 30 contact the workpiece W in different areas than the standoffs 96 of the second rotor 32, so that areas previously masked by standoffs 96 may be cleaned. Spent cleaning chemistry is collected in the second receiving channel 116 of the weir assembly 112, which is designed to minimize splash back.

By processing or cleaning the workpiece W in both the second and third processing configurations, all surfaces of the workpiece W are cleaned to prevent contamination of the workpiece W as a result of insufficient cleaning. In previously designed processing assemblies, unetched and uncleaned areas (i.e., masked areas) were left on the workpiece surface under the contacts required for holding the workpiece. As a result of the positionable rotor assembly 24 described herein, cleaning can be performed on all workpiece contact surfaces, including both back side and bevel contact points.

The fourth step of the exemplary operational process is a tertiary processing step. Referring to FIG. 8, the workpiece W is received in the processing assembly 10 in the fourth processing configuration, i.e., the rotor assembly 24 is moved back to the first (down) position and the chemistry collection assembly 28 is moved to the third (intermediate) position. To achieve this processing configuration, the vortex force is maintained in the cavity 58 of the first rotor 30 to force the workpiece W to the contact surfaces on the first rotor 30, then the rotor assembly 24 is actuated from the second (up) position (see FIG. 7) to the first (down) position (see FIG. 8), and the weir assembly 112 is moved from the second (up) position (see FIG. 7) to the third (intermediate) position (see FIG. 8).

When transitioning from the third processing configuration (FIG. 7) to the fourth processing configuration (FIG. 8), the first rotor 30 re-nests with the second rotor 32. In this transition, the workpiece W is transferred from the standoffs 60 on the first rotor 30 back to the standoffs 96 on the second rotor 32.

In the fourth processing configuration, the workpiece W outer edge (bevel), front and back sides may be rinsed (for example, using rinsing water). The workpiece W bevel and front side may be processed using, for example, a swing arm assembly of the chemistry delivery assembly 26. The workpiece W back side may be processed using the back side delivery nozzle 94 of the chemistry delivery assembly 26. Spent rinsing chemistry is collected in the third receiving channel 118 of the weir assembly 112.

The fifth step of the exemplary operational process is a return to the first processing configuration (see FIG. 5) for automation removal of the workpiece W from the processing assembly 10.

Now referring to FIG. 9, a processing assembly formed in accordance with another embodiment of the present disclosure will be described. The processing assembly is substantially identical in materials and operation as the previously described embodiment, except for differences regarding the rotor assembly, which will be described in greater detail below. For clarity in the ensuing descriptions, number references of like elements of the processing assembly 10 are similar, but are in the 900 series for the illustrated embodiment of FIG. 9.

Figure 9:
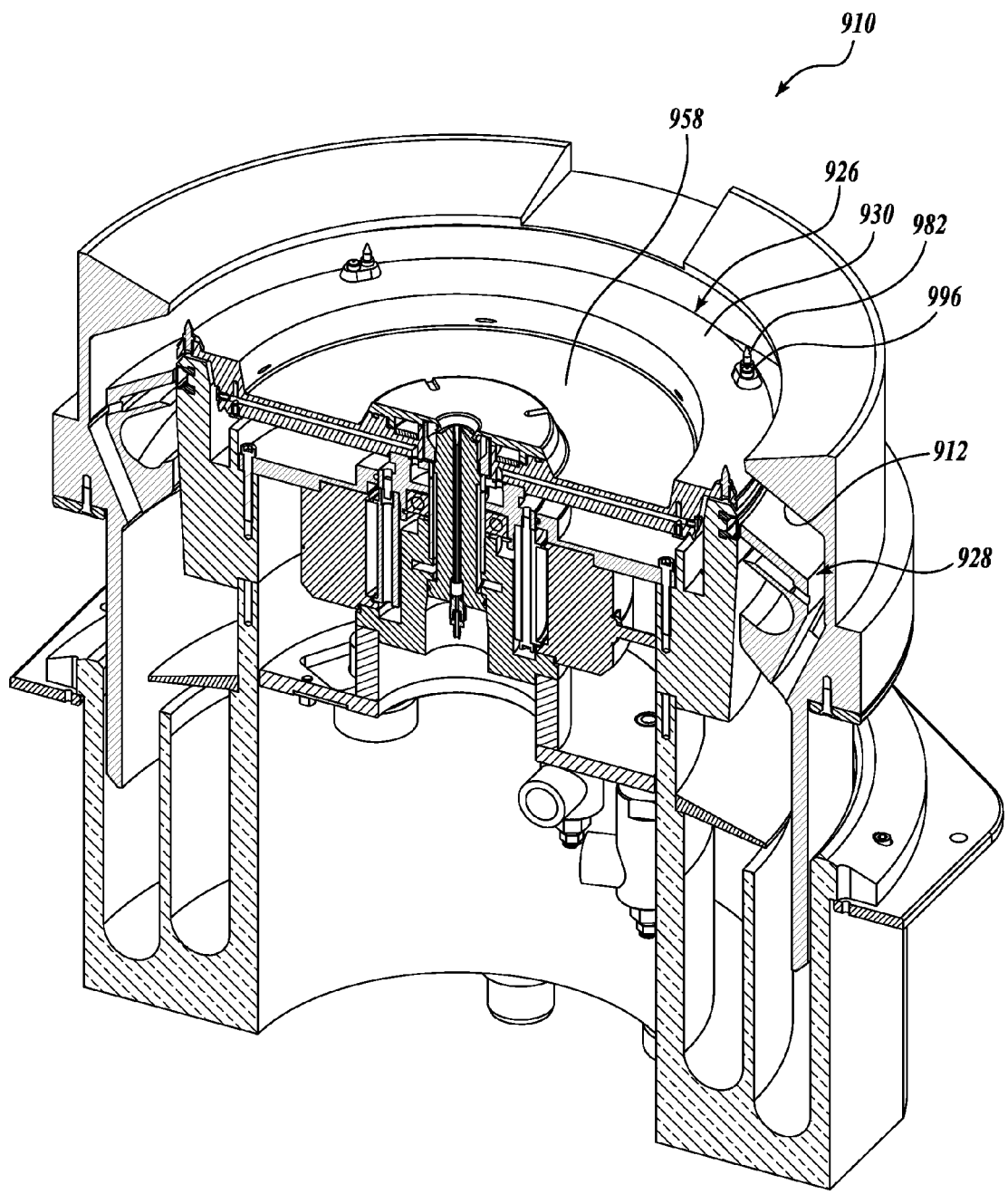
FIG. 9 is a cross-sectional isometric view of a portion of a processing assembly in accordance with another embodiment of the present disclosure.

The processing assembly 910 shown in FIG. 9 includes a rotor assembly 924 that has only one rotor 930. In that regard, the single rotor 930 is both a centering rotor and a chuck rotor. The rotor 930, like rotor 30 in the previously described embodiment, has a vortex cavity 958 for creating a pressure differential for maintaining a workpiece W on the rotor 930 when the rotor 930 is spinning. Because there is a single rotor 930 in the present embodiment, the workpiece W cannot be transitioned to process masked areas, for example, areas on the workpiece W bevel or back side that are hidden from the chemistry by centering guide posts 982 or standoffs 996. For this reason, the present embodiment is primarily used in processes that do not require cleaning of these masked areas.

Like the processing assembly 10 previously described, the processing assembly 910 of the present assembly includes a chemistry collection assembly 928 including a moveable weir assembly 912.

While illustrative embodiments have been illustrated and described, it will be appreciated that various changes can be made therein without departing from the spirit and scope of the disclosure.

The embodiments of the disclosure in which an exclusive property or privilege is claimed are defined as follows:

1. A processing assembly for a semiconductor workpiece, the processing assembly comprising:
    (a) a rotor assembly capable of spinning a workpiece, wherein the rotor assembly includes first and second rotors;
    (b) a chemistry delivery assembly for delivering chemistry to the workpiece; and
    (c) a chemistry collection assembly for collecting spent chemistry from the workpiece, wherein the chemistry collection assembly includes a weir assembly surrounding the rotor assembly and having a plurality of weirs.

2. The processing assembly of claim 1, wherein the first rotor includes a first workpiece receiving portion and the second rotor includes a second workpiece receiving portion.

3. The processing assembly of claim 2, wherein the first rotor is a chuck rotor and the second rotor is a centering rotor.

4. The processing assembly of claim 2, wherein the first and second rotors are capable of nesting with each other.

5. The processing assembly of claim 2, wherein the first rotor includes a vortex cavity for maintaining the workpiece on either of the first or second rotors.

6. The processing assembly of claim 2, wherein the first rotor is capable of moving to at least first and second positions.

7. The processing assembly of claim 1, wherein the rotor assembly is movable to provide a first workpiece receiving portion at a first axial position and a second workpiece receiving portion at a second axial position.

8. The processing assembly of claim 1, wherein the weir assembly is capable of moving to a plurality of positions to align one of the plurality of weirs with the rotor assembly for collecting spent chemistry from the workpiece.

9. The processing assembly of claim 1, wherein the weir assembly includes first, second, and third weirs.

10. The processing assembly of claim 1, wherein at least one of the plurality of weirs is designed to minimize chemistry splash.

11. The processing assembly of claim 1, wherein the weir assembly includes an inflatable seal to minimize chemistry leakage from at least one of the plurality of weirs.

12. The processing assembly of claim 1, wherein the rotor assembly includes a transmission assembly including a polymer coupling for transmitting torque.

13. A method of processing a semiconductor workpiece, the method comprising:
    (a) receiving a workpiece in a processing assembly, wherein the processing assembly includes a rotor assembly for rotating the workpiece, a chemistry delivery assembly, and a chemistry collection assembly including a weir assembly, wherein the rotor assembly is capable of moving to at least first and second axial positions to process the workpiece;

(b) moving the weir assembly from a first position to a second position;

(c) processing the workpiece when the weir assembly is in the second position;

(d) moving the weir assembly from the second position to a third position; and (e) processing the workpiece when the weir assembly is in the third position.

14. The method of claim 13, further comprising moving at least one of the rotor assembly and the chemistry collection assembly, and processing the workpiece.

15. The method of claim 13, wherein the rotor assembly includes a vortex cavity for maintaining the workpiece on the rotor assembly.

16. The method of claim 13, wherein processing is selected from the group consisting of a back side etching process, a bevel etching process, and a rinsing process.

17. A method of processing a semiconductor workpiece, the method comprising:

(a) receiving a workpiece in a processing assembly, wherein the processing assembly includes a rotor assembly for rotating the workpiece, a chemistry delivery assembly, and a chemistry collection assembly including a weir assembly having first and second weirs;

(b) processing the workpiece when the rotor assembly is in a first axial position, including delivering a first chemistry to the workpiece and collecting the spent first chemistry in a first weir;

(c) moving the rotor assembly from the first axial position to a second axial position; and (d) processing the workpiece in the second axial position, including delivering a second chemistry to the workpiece and separately collecting the spent second chemistry in a second weir.

18. A processing assembly for a semiconductor workpiece, the processing assembly comprising:

(a) a rotor assembly capable of spinning a workpiece, wherein the rotor assembly includes first and second workpiece receiving portions, and wherein the rotor assembly is movable to provide a first workpiece receiving portion at a first axial position and a second workpiece receiving portion at a second axial position;

(b) a chemistry delivery assembly for delivering chemistry to the workpiece; and (c) a chemistry collection assembly for collecting spent chemistry from the workpiece, wherein the chemistry collection assembly includes a weir assembly surrounding the rotor assembly and having a plurality of weirs.

19. A processing assembly for a semiconductor workpiece, the processing assembly comprising:

(a) a rotor assembly capable of spinning a workpiece, wherein the rotor assembly is capable of moving to at least a first axial position for processing the workpiece and a second axial position for processing the workpiece;

(b) a chemistry delivery assembly for delivering chemistry to the workpiece; and (c) a chemistry collection assembly for collecting spent chemistry from the workpiece, wherein the chemistry collection assembly includes a weir assembly surrounding the rotor assembly and having first, second, and third weirs.

20. A processing assembly for a semiconductor workpiece, the processing assembly comprising:

(a) a rotor assembly capable of spinning a workpiece, wherein the rotor assembly includes a transmission assembly including a polymer coupling for transmitting torque;

(b) a chemistry delivery assembly for delivering chemistry to the workpiece; and (c) a chemistry collection assembly for collecting spent chemistry from the workpiece, wherein the chemistry collection assembly includes a weir assembly surrounding the rotor assembly and having a plurality of weirs.

21. A processing assembly for a semiconductor workpiece, the processing assembly comprising:

(a) a rotor assembly capable of spinning a workpiece, wherein the rotor assembly is capable of moving to at least a first axial position for processing the workpiece and a second axial position for processing the workpiece;

(b) a chemistry delivery assembly for delivering at least first and second chemistries to the workpiece; and (c) a chemistry collection assembly for collecting spent chemistry from the workpiece, wherein the chemistry collection assembly includes a weir assembly surrounding the rotor assembly and having a plurality of weirs that allows for the separate collection using separate channels of the at least first and second chemistries used during processing.

22. A method of processing a semiconductor workpiece, the method comprising:

(a) receiving a workpiece in a processing assembly, wherein the processing assembly includes a rotor assembly, a chemistry delivery assembly, and a chemistry collection assembly including a weir assembly;

(b) spinning the workpiece on the rotor assembly;

(c) moving the weir assembly from a first position to a second position and processing the workpiece when the weir assembly is in the second position; and (d) moving the rotor assembly from a first axial position to a second axial position and processing the workpiece when the rotor assembly is in the second position and the weir assembly is in the second position.

23. A method of processing a semiconductor workpiece, the method comprising:

(a) receiving a workpiece in a processing assembly, wherein the processing assembly includes a rotor assembly, a chemistry delivery assembly, and a chemistry collection assembly including a weir assembly;

(b) rotating the rotor assembly using a transmission assembly including a polymer coupling for transmitting torque; and (c) moving the weir assembly from a first position to a second position and processing the workpiece when the weir assembly is in the second axial position.

* * * * *